(12) United States Patent
Yeh

(10) Patent No.: US 10,274,537 B2
(45) Date of Patent: Apr. 30, 2019

(54) TEST DEVICE FOR DEFECT INSPECTION

(71) Applicant: Hermes Microvision Inc., Hsinchu (TW)

(72) Inventor: Chang-Chun Yeh, Hsinchu (TW)

(73) Assignee: HERMES MICROVISION INC., Hsinchu (TW)

( * ) Notice: Subject to any disclaimer, the term of this patent is extended or adjusted under 35 U.S.C. 154(b) by 0 days.

(21) Appl. No.: 15/386,735

(22) Filed: Dec. 21, 2016

(65) Prior Publication Data

US 2017/0176358 A1 Jun. 22, 2017

Related U.S. Application Data

(60) Provisional application No. 62/270,090, filed on Dec. 21, 2015.

(51) Int. Cl.
*G01R 31/307* (2006.01)
*H01J 37/28* (2006.01)

(52) U.S. Cl.
CPC ............ *G01R 31/307* (2013.01); *H01J 37/28* (2013.01)

(58) Field of Classification Search
CPC ........ G01R 31/307; H01J 37/00; H01J 37/02; H01J 37/22; H01J 37/222; H01J 37/228; H01J 37/244; H01J 37/26; H01J 37/261; H01J 37/263; H01J 37/3023; H01J 37/0326; H01J 37/28
USPC ............................. 250/306, 307, 311, 492.3
See application file for complete search history.

(56) References Cited

U.S. PATENT DOCUMENTS

| | | | | |
|---|---|---|---|---|
| 4,204,155 A | | 5/1980 | Terry | |
| 8,748,814 B1 | * | 6/2014 | Xiao | H01J 37/28 250/306 |
| 2003/0071262 A1 | * | 4/2003 | Weiner | G01N 21/66 257/48 |
| 2007/0111342 A1 | * | 5/2007 | Satya | H01L 22/34 438/17 |
| 2008/0246030 A1 | * | 10/2008 | Satya | H01L 22/34 257/48 |
| 2009/0212793 A1 | * | 8/2009 | Guldi | H01L 22/14 324/762.05 |
| 2013/0071262 A1 | * | 3/2013 | Green | E21B 43/122 417/65 |

FOREIGN PATENT DOCUMENTS

TW 430906 B 4/2001

* cited by examiner

*Primary Examiner* — Jason L McCormack
(74) *Attorney, Agent, or Firm* — Finnegan, Henderson, Farabow, Garrett & Dunner, LLP

(57) ABSTRACT

A structure, for defect inspection, is provided, which includes a scanning pad scanned by an electron beam inspection tool and a test key. The structure can be located in the scribe line. A virtual grounding pad is further provided if the test key is located in the dummy pattern regions.

24 Claims, 12 Drawing Sheets

TEST DEVICE FOR DEFECT INSPECTION

CLAIM OF PRIORITY

This application claims the benefit of priority of U.S. provisional application No. 62/270,090 entitled to Yeh et al. filed Dec. 21, 2015 and entitled "Structure for Being Inspected by Using EBI", the entire disclosures of which are incorporated herein by reference.

BACKGROUND OF THE INVENTION

1. Field of the Invention

The present invention relates to a test device for defect inspection, and more particularly to a test device for VC mode defect inspection by using at least one charged particle beam.

2. Description of the Prior Art

Undoubtedly, compared to any other technology or knowledge, semiconductor devices not only impact nowadays society but also influence our daily life. Although it can be traced to two centuries ago, for example Alessandro Volta in 18th century and Michael Faraday in 19th century, the history of semiconductor development indeed influences mankind in commercial semiconductor devices is 20th century. In the first, vacuum tube transistor is replaced by the semiconductor devices which mainly include BJT (Bipolar Junction Transistor) and MOSFET (Metal-Oxide-Semiconductor Field Effect Transistor), and then the semiconductor devices are minimized into integrated circuits. No matter digital logic circuit device, analog circuit device or communication devices, these semiconductor devices can be fabricated on silicon-based substrate or semiconductor compound substrate. Another semiconductor devices are photoelectronic devices which mostly include LED (Light Emitting Diode), LD (LASER Diode) or photovoltaic cell base on photoelectric effect. Currently, digital electronic devices based on MOSFET fabricated in silicon substrate are commercially the most significant, and the applications of the devices are processors and memory devices.

Fabrication processes for manufacturing ICs in the silicon substrate include cleaning process, oxidation and thermal process, ion-implementation process, thin film deposition, lithography, etching process and CMP (Chemical Mechanical Polishing) process. By the combination of the above processes, when all electronic devices are formed in the substrate, and then followed by metallization process to electrically connect all electronic devices, a specific application device, such as CPU, ASIC, FPGA, DRAM, or Flash, can be produced. With the technology progress of semiconductor process, the smaller width of an electronic device followed by Moore's law which means transistors are doubled every 18 to 24 months, the more devices in one wafer can be fabricated to cost down.

The semiconductor fabrication processes include ion implantation process, thermal process, thin film deposition process, etching process, CMP (Chemical Mechanical Polishing) process, lithography, and cleaning process. And they will be briefed hereinafter.

Ion-implantation process will direct group III or group V atoms implanted into silicon substrate to alter local electric conductivity such that some regions are positive conductivity and some regions are negative conductivity. Phosphorus or Arsenic atoms are usually used for the negative conductivity, while Boron atom is usually used for the positive conductivity.

Thermal process provides formation of thermal oxide layer and annealing for drive-in after ion-implantation. In the present art, RTP (Rapid Thermal Process) is popular instead of conventional thermal process in furnace. It includes RTO (Rapid Thermal Oxidation) and RTA (Rapid Thermal Annealing) to respectively form silicon oxide and repair lattice damages after ion-implantation such that single crystal structure can be recovered and dopant can be activated.

Thin film deposition process includes PVD (Physical Vapor phase Deposition) and CVD (Chemical Vapor phase Deposition) to form several to several tens thin film layers with variant materials and thicknesses on silicon substrate. Metal layers, formed on a substrate, always provide electric interconnections among devices, while dielectric layer provides isolation between metal layers. Chemical reactions in vapor phase, happened to form thin films in CVD, include MOCVD (Metal-Organic CVD), APCVD (Atmosphere Pressure CVD), LPCVD (Low Pressure CVD), HPCVD (Hybrid Physical CVD), RTCVD (Rapid Thermal CVD), HDPCVD (High Density Plasma CVD), and PECVD (Plasma Enhanced CVD). Thin films forms by CVD usually include silicon oxide, silicon nitride, polysilicon, metal tungsten, metal aluminum, and metal titanium nitride. Metal target are heated or bombarded in vacuum such that atoms on the metal target can be transferred to substrate surface to form thin film in PVD, which includes evaporation and sputtering. Metal thin films, such as aluminum, titanium, or alloy thereof, are always formed by using PVD. Quality control of the thin film is critical to IC process, so thin film process must be monitored throughout the procedure to reflect abnormal, such that thickness uniformity and defect and be avoided.

Etching process, which includes wet etch and dry etch, is to remove material. In the semiconductor process, patterns on a reticle can be transferred to a thin film by using etch process. Wet etching is isotropic by reacting etchant to selective material, and etched profile always reveals bowl-like shape. Dry etch is popular and anisotropic by reacting plasma in an external electric field with the selective material, and etched profile will reveal vertical-like shape.

CMP is another method to remove material, which introduce slurry between polish pad and wafer with chemical and mechanical reactions to achieve whole wafer planation, such that thin films in the following process can be formed better. Silicon oxide layer, metal layer and polysilicon layer are most applied in the CMP process.

Lithography process, also named photo-lithography process, is the most critical in the semiconductor process, which includes PR (photo Resist) layer coating, soft bake, exposure, development, hard bake, and ash after etching process. The PR can be selectively removed through exposure and development, and circuit patterns can be transferred to a specific material. When the semiconductor process continues shrinking, available RET (Resolution Enhancement technology), such as OPC (Optical Proximity Correction), immersion lithography, and EUV (Extreme Ultraviolet lithography, are applied.

Cleaning process must be processed after all other process recited above to avoid uninvited particles or residues to impact device quality, which includes rinsing wafer by DI (De-Ionized) water and drying the wafer. Ultrasonic agitation can be applied in the cleaning process. This process will clean out all pollutions, such as particles, organic matter, inorganic matter, metal ions.

Defects are inevitably generated in the semiconductor process, which will greatly impact device performance, even failure. Device yield is thus impacted and cost is raised. Current defects can be classified into systematic defects and random defects in general. On the one hand, system defects infer defects will be found repeatedly and systematically in wafers, in which defect patterns can be used as reference in classification to determine root cause of which process incurs such defects. In order to increase semiconductor process yield, it is critical to enhance yield by monitoring, such as by using SEM (Scanning Electron Microscope), systematic defects highly appeared regions in mass production process to real time eliminate systematic defects. On the other hand, the non-systematic defects, random particle defects, are random residues left in wafers. Distributions and characteristic profiles are important references to distinguish systematic defects from non-systematic defects.

More specifically, systematic defects can be classified as reticle errors in alignment or machine offset, process mistakes incurred by recipes or materials, prober damages in wafer probing, scratches on wafer surface, and wafer edge effect of topography incurred from non-uniformity of PR coating or thermal stress.

The corresponding defects are recited hereinafter in brief. Defects incurred in lithographic process include PR residue defects due to PR deteriorated or impurity, peeling defects, bridge defects, bubble defects, and dummy pattern missing defects due to pattern shift. Defects incurred in etching process include etching residue defects, over-etching defects and open circuit defect. Defects incurred in CMP process include slurry residue defects, dishing defects and erosion defects due to variant polishing rates, scratched due to polishing. Further, when process nodes continue shrinking, new materials and processes will be introduced to inevitably incur new type defects. For example, because physical dimension of patterns are smaller than the optical resolution of the applied lithographic wavelength (193 nm), the critical dimension exposed on wafers may incur offset. Thinning defects are another inevitably incurred in the process node shrinking. In order to reduce RC delay in multi-layered interconnection structures, low-k dielectric layer and cupper material are introduced. Cupper can't be etched and hence damascene process is introduced that metal is filled into dielectric layer. Therefore, some other hidden defects are covered under layer, such as void defects, etching residue defects, over-etching defect, under layer particles, and via open incurred in the interconnection process. Such hidden, crucial defects are too hard to be analyzed and eliminated.

For the non-systematic defects are mainly random particles defect incurred from particles in air randomly fallen on the wafer, which are not easy to be identified and resolved.

In order to enhance semiconductor process yield, defects have to be identified as soon as possible to prevent from impact pouring out. Optical microscope is used in conventional optical inspection which includes bright field inspection and dark field inspection. Every die on a wafer is scanned by optical beam and images of every die are generated and stored.

When semiconductor nodes continue shrinking, dimensions of defect shrink also. Unimportant small defects in previous now become critical therefore. It is a challenge to identify such small defects by using conventional optical inspection tool and a new tool is necessary. One method is to combine the operations of optical inspection and review SEM. Because of resolution, the optical inspection is not enough to meet requirement of identifying defects, but a suspect region in blurred images can be determined defect-like and reviewed by review SEM with high resolution. Thus defects can be identified and analyzed. Another method is to illuminate dual beams on a wafer surface to obtain interference patterns, and defect regions always have different interference pattern to that of the normal region. Thus, defects can be identified and further analyzed by review SEM. In practice, defects must be identified first and locations of the defects are forward to review SEM with high resolution to analyze defects.

The ebeam inspection tool is to find or identify defects in the semiconductor process, and relative to review SEM, a large FOV (Field-of-View) and large beam current are commercial means to enhance inspection throughput. In order to obtain large FOV, a SORIL (Swing Objective Retarding Immersion Lens) system is applied commercially. Moreover, resolution is sometimes lowered, compared to review SEM, enough to capture defects.

The ebeam inspection tool is designed different from the review SEM. The review SEM is designed to known, identified defects or suspects of defect, so scan duration is long enough to analyze or review defects, and hence it can't process inspection. On the other hand, the ebeam inspection tool, with high scanning rate than the review SEM and high resolution than the optical inspection tool, can identify defects that the optical inspection tool in no way to capture.

Furthermore, in lithographic process, some particular patterns may have great possibility to incur defects, but won't incur them each time. The defects generated by these particular patterns even can't be modified through recipe tuning or modifying reticle directly. Such a kind of patterns is named hot spot, and must be monitored in-line process.

Applications of SEM, except yield management tool of ebeam inspection and analysis tool of review SEM, may further be metrology tool in semiconductor manufacturing process; that is CD (critical Dimension)-SEM. CD-SEM will measure CD in a wafer with by line-scanning sample with moving stage to reveal process uniformity. Moreover, in order to obtain exact dimension, resolution is very critical, and thus low beam current must be applied.

Besides, one way to identify electric defects in the die is disclosed in the U.S. Pat. No. 4,204,155A, which provides a resistivity probe head, or a four-point probe, is used to directly contact the semiconductor device for obtaining the defect results.

Another prior art, TW patent 430,906, discloses another way to monitor and inspect cross-contamination of the conventional technique, which is a four-point probe method. The cross-contamination is caused by the ion implantation which produces unexpected dopants in the wafer, and the concentration of the unexpected dopants is usually so high that the electricity of a wafer becomes abnormal. Further, the wafer will be scrapped by the four-point probe easily.

In conclusion, both the two prior arts aforementioned can only provide electrical characteristic results; that is, the tested results only come from the electrically contact between the four-point probe and the test circuit configured in the scribe line within a die. However, since the fabrication process of the test circuit is different from that of the die, the test result of the test circuit configured in the scribe line may be actually different from that of the die itself. Thus, the test result is not so precise enough and is unreliable as well. Hence, one accurate and reliable test method or structure for testing the die is necessary.

SUMMARY OF THE INVENTION

This invention relates to a test device for defect inspection by using at least one charged particle beam. For the electric open/short circuit incurred by fine pattern defects, these defects in the present invention can be inspected by using VC(voltage Contrast) mode instead of conventional pattern compare, wherein throughput can be prevailed in VC mode. Thus, large beam current and low resolution, used in the VC mode, can be applied to inspect fine pattern defects. Further, because the only scanned area is a scanning pad in the test device, there is no necessary to scan the fine pattern to further increase inspection throughput. In the present invention, because the test device is fabricated with the same process to the semiconductor device, accuracy to capture defects will be achieved. When the test device is formed in the dummy pattern, accuracy to capture defects can be further increased due to identical fabrication process.

Therefore the present invention provides a device for inspecting a defect, which comprises a scanning pad on a dielectric layer, and a test structure, mapping to a pattern of an electric circuit on the dielectric layer, having a first end electrically connected to the scanning pad and a second end grounded. The defect in the electric circuit is identified according to a grey level of an image of said scanning pad scanned by a charged particle beam tool. The charged particle beam tool is an ebeam inspection tool, and the defect is identified by a VC mode.

The test structure can be located at scribe lines of a wafer, or designed as a dummy pattern in a die. The device may further comprise a grounding pad electrically connected to the second end of the test structure. The grounding pad has a larger area than that area of the test structure.

The test structure may include at least one periodic pattern, and the periodic pattern is a periodic indentation pattern for detecting an open circuit defect. The test structure may include a first periodic pattern and a second periodic pattern, and the first periodic pattern is a periodic indentation pattern and the second periodic pattern is a periodic comb pattern interlacing with the first periodic pattern for detecting a short circuit defect. The first end is one end of the first periodic pattern and the second end is one end of the second periodic pattern opposite to the first end.

The present invention also provides a method for inspecting a defect, which comprises a step of scanning a scanning pad on a dielectric layer by using an ebeam inspection tool, wherein the scanning pad electrically connecting to a first end of a test structure, the test structure mapping to a pattern of an electric circuit on the dielectric layer and having a second end grounded; and a step of identifying the defect in the electric circuit according to a grey level of an image of the scanning pad.

The test structure is designed as a dummy pattern in a die. A grounding pad is provided to electrically connect to the second end of the test structure and having a larger area than that area of the test structure. The identifying step uses a VC mode.

The test structure may include at least one periodic pattern, and the periodic pattern is a periodic indentation pattern for detecting an open circuit defect. The test structure may include a first periodic pattern and a second periodic pattern, and the first periodic pattern is a periodic indentation pattern and the second periodic pattern is a periodic comb pattern interlacing with the first periodic pattern for detecting a short circuit defect. The first end is one end of the first periodic pattern and the second end is one end of the second periodic pattern opposite to the first end.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF EXAMPLE EMBODIMENTS

Figure 1:
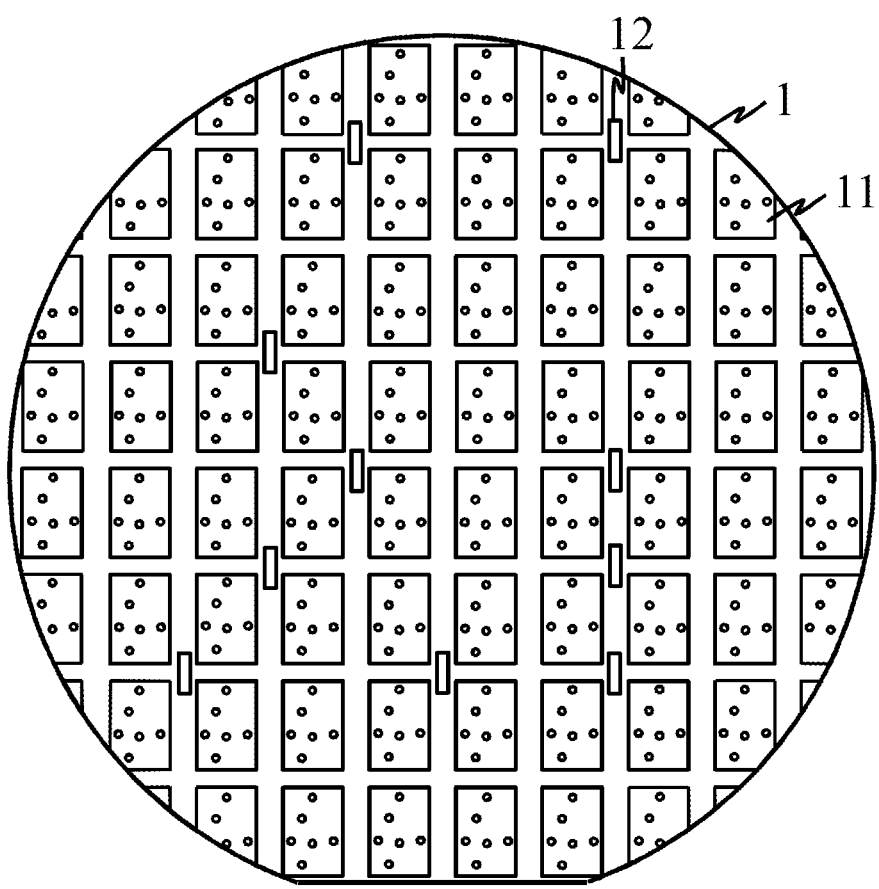
FIG. 1 is a schematic illustration of a wafer with a plurality of dice separated by scribe lines, wherein test devices are formed in the scribe lines in accordance with a first embodiment of the present invention.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

Although the following embodiments will be illustrated by using the electron beam, the charged particle beam can be applied in the present invention.

As illustrated in FIG. 1, a wafer 1 is provided, wherein a plurality of dice 11 formed thereon. These dice 11 are separated by scribe lines 12, and in accordance with an embodiment of the present invention, test device 12 can be formed on the scribe line. In the present invention, wafer 1 can be silicon, silicon-carbide, III-V compound semiconductor, II-VI compound semiconductor with any kind of orientation. The dice 11 in FIG. 1 are formed at some specific status in the semiconductor process, such as MOSFETs are formed on the wafer covered by an ILD (Inter Level Dielectric) layer without metallization, or the first metal layer is formed on the ILD layer.

Figure 2:
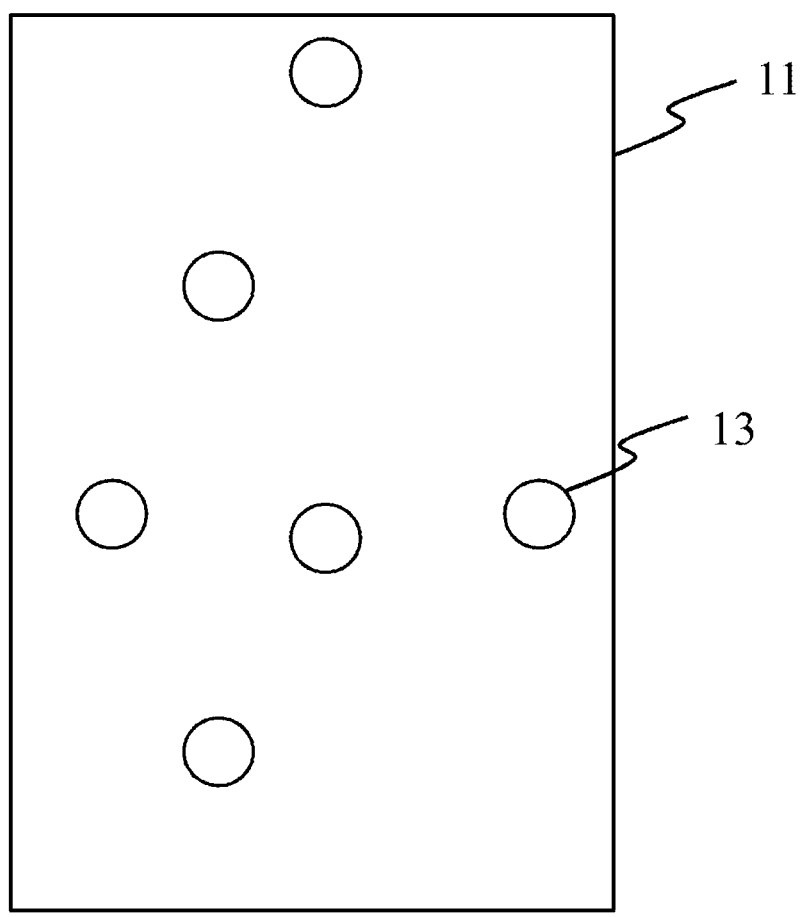
FIG. 2 is a schematic illustration of a die with a plurality of dummy patterns, wherein test devices are formed in the dummy patterns in accordance with a second embodiment of the present invention.

Next, please refer to FIG. 2, wherein a single die 11 is illustrated with a plurality of dummy patterns 13 therein. For preventing from cross talk and parasitic capacitor, planarization, or other process uniformity concern, dummy patterns 13 are always designed inside a die 11. The dummy pattern 13 should be electrically isolated from the device in the die 11 and should be floated. According to an embodiment of the present invention, the test device can be formed inside the dummy patterns 13.

Figure 3:
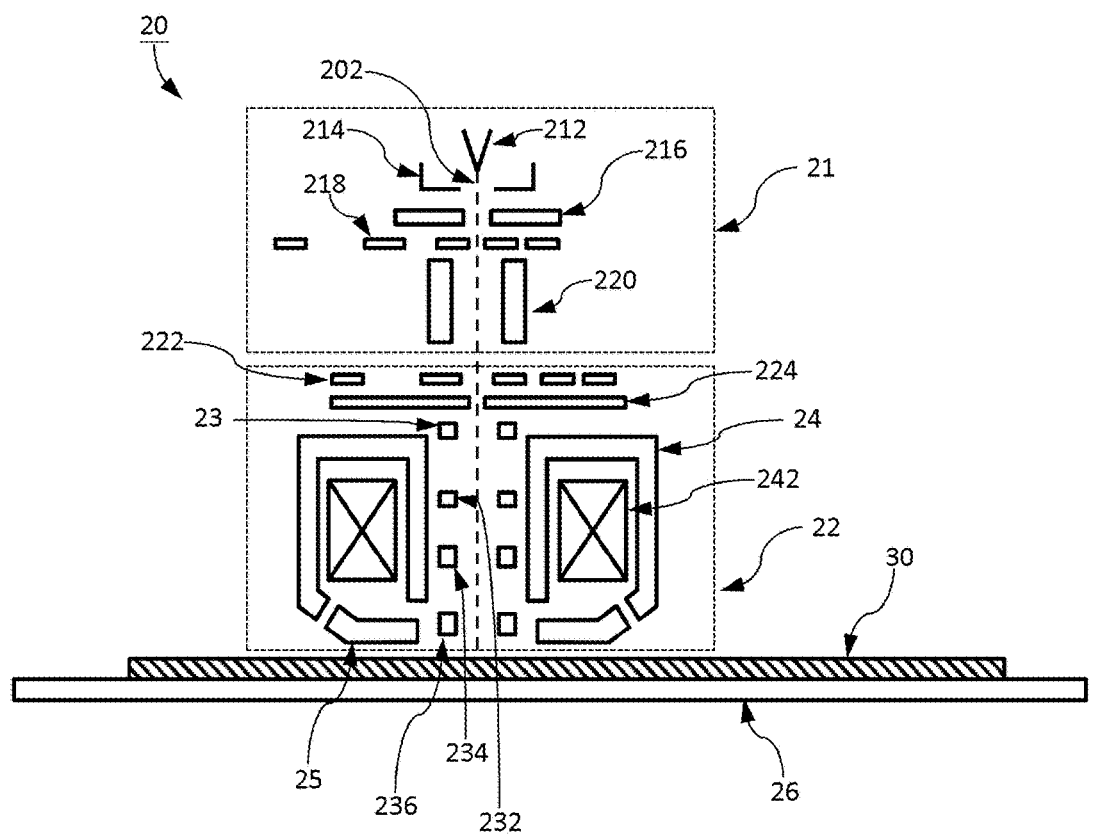
FIG. 3 is a schematic illustration of an ebeam inspection tool in accordance with the present invention.

As FIG. 3 illustrates, the EBI tool 20 comprises two parts which are an electron gun system 21 and an image system 22. In the electron gun system 21, the Schottky emitter is usually used as the electron source 212, which combines the functions of the thermionic emission and the field emission. More specifically, the electron source 212 includes a ceramic substrate, two electrodes, a tungsten filament, and a tungsten pin. The two electrodes are fastened to the ceramic substrate in parallel, and the other sides of the two electrodes are respectively connected to two ends of the tungsten filament. The tungsten filament is slightly bended to form a convex point for placing the tungsten pin. Then, ZrO is coated close to the tip of the tungsten pin for lowering the work function of the tungsten so as to allow the electrons to overcome the work function thereof at lower temperature, such as 1300K~1800K, and to be emitted. Furthermore, the anode electrode 216 also provides an electric field to extract electrons from the tip of the tungsten pin. By applying a suppressor electrode 214 around the tungsten tip, the electrons emitted from the tip can be suppressed to the optical axis. Accordingly, the electron beam which has the large spread angle is suppressed to the primary electron beam, and thus the brightness of the electron beam can be enhanced. As a result, the Schottly emission of the electron source 212 has the advantages of long lifetime, high brightness, high stability, and no flashing requirement.

In order to provide high throughput in the ebeam inspection, a large beam current is necessary. However, the large beam current will incur the Coulomb's compulsive force inside the electron beam, and thus beam spot is enlarged to deteriorate resolution. A first aperture array 218 is provided below the electron source 212 for lowering the Coulomb's compulsive force.

The condenser lens 219 is located beneath the first aperture array 218 and is used for collimation of the electron beam in the EBI tool 20, which can be an electrostatic lens or a magnetic lens. The electron beam, after condensed, is substantially parallel in the EBI tool 20. The purpose without formation of crossover after the condenser lens 219 is that larger beam current will incur deteriorated beam spot size after the crossover. In order to provide some particular functions, such as much larger beam current, an immersion magnetic lens can be applied.

The blanker 220 is located beneath the condenser lens 219. When the primary electron beam is not used, the blanker 220 is provided for blanking the primary electron beam out. The stigmator 121 is located beneath the blanker 220. The astigmatism of the electron beam might be caused by the condenser lens 219 or the deflector. More specifically, the astigmatism is occurred due to unequal condense strength of the condenser lens 219 or the uneven deflection strength of the deflector. Hence, the stigmator 221 which comprises several electrodes is applied for correcting the astigmatism of the electron beam.

The image system 22 below the electron gun system 21 includes a second aperture array 222, a SORIL (swing objective retarding immersion lens), a detector 224, and a Wien filter 23. The second aperture array 222, positioned beneath the electron gun system 21, has several apertures with different sizes for trimming the primary electron beam to a desired beam current.

The deflection unit in the SORIL system may be classified into four types according to the variant functions. The first type is the swing function, which includes a pre-lens deflector 232 positioned on the SORIL system for tilting the primary beam into a pre-determined angle for the swing objective lens and a swing deflector 238 positioned near the upper pole piece of the objective lens for swing the optical axis of the objective lens. The second type is the scanning function, which includes two scanning deflectors 234, 236 located under the pre-lens deflector 232 for conventionally scanning the primary beam on the sample. The third type is a compensation deflector 25 located under the swing deflector 238 with the aberration compensation function, which corrects or compensates primary beam with large tilt angle. The last deflector 25 can also provide a retard field to the primary beam.

The objective lens in the EBI tool is the SORIL system, which functions swing, retard, immersion, and focus. The SORIL system provides a compound electromagnetic lens, which include a convention magnetic lens and an electrostatic lens. The latter is configured by the upper pole piece of the yoke 24, the last deflector 25, and the sample 30, which provides a concave lens to the SORIL system.

When the primary beam bombards the sample 30, some electron signals induced. These signal electrons emanated from the sample 30 might include a secondary electron (SE) and a backscattering electron (BSE), and the SE and the BSE have different energies. The energy of the SE is the lowest among the signal electrons, which is lower than 50 eV, and the energy of the BSE is higher than that of SE. The most energy of the BSE is close to the landing energy of the primary beam.

Since they have different energies, their applications are different as well. Briefly, the SEs are usually used for analyzing the sample's topography, and the BSEs are applied for analyzing the sample material. The properties of the SEs and BSEs will be explained more specifically later.

When the primary electron beam incidents to a depth of less than about 100 Å in the sample 30, the SEs will be induced by the inelastic interaction of the electron beam and the valence electrons in the sample 30. Since the energy of the SE is so weak, which is less than 50 eV, the SEs deeper inside the sample cannot escape from the surface.

Besides, the SE yield depends on the topography surface of the sample 30. For example, if the sample surface or the incident direction of the electron beam is tilted, the SEs in the edge of the sample can escape more easily out of the sample due to no barrier blocks the SEs. Thus, the SE yield of the sample edge is much higher than the sample center, such that the edge of the sample 30 is always brighter than the sample center. Because the SEs are induced from the sample surface, the SEs can be used to form a topography information of the sample 30.

On the other hand, if the primary electron beam incidents to the sample 30 with a depth about 1~2 um, the electrons of the primary electron beam have the elastic or inelastic interaction with the nuclei of atom in the sample 30, so that the BSEs are generated and backscattered out of the sample 30 and they have higher energies than the SEs, which are higher than 50 eV, most close to the landing energy of the primary beam. Besides, the BSEs yield varied with the atom number, so the BSEs are most applied for analyzing the material of the sample 30.

The Wein filter 23, positioned on the pre-lens deflector 232 in the EBI tool 20, keeps the direction of the primary beam and deflects the signal electrons to another direction where the detector 224 is located. The Wien filter 23 is placed below the detector 224 for directing the electron beam to the detector 224. The Wien filter 23 is composed of the electric field and the magnetic field which is orthogonal to the electric field. By changing the strength of the electric field or the magnetic field, the direction of the signal electrons can be controlled. Therefore, the signal electrons are directed to the detector 224.

The detector 224 used in the EBI tool 20 can be E-T detector or SDD. The location of the detector 224, in principle, is as much close to the sample to receive most signal electrons. However, in the EBI tool 20, the SORIL system will limit the working distance between the sample and the SORIL system. Hence, the detector 224 can't be configured between the sample 30 and the SORIL system, and thus can be located above the objective lens as the in-lens detector only.

Figure 4A:
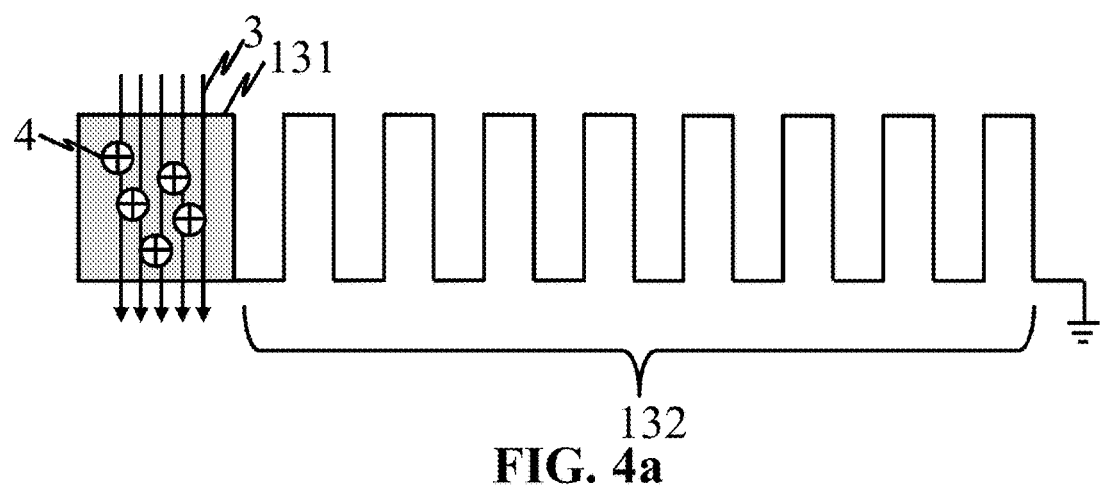
FIG. 4a is a schematic illustration of a test device for open circuit defect inspection in scribe line in normal status in accordance with a third embodiment of the present invention.

Please refer to FIG. 4a, the test device includes a scanning pad 131 and a grounded test structure 132 which also named as test key. The test structure 132 in the present invention includes a periodic indentation pattern or square-wave like pattern, which basically mimics patterns with several lines grouped in a local region. In the semiconductor manufacturing process, there may be a region of line is open due to exposure in the lithographic process or over-etching. In this embodiment, the test device is located in the scribe line, and the test structure 132 can be grounded to wafer substrate directly. The electron beam is scanned as the arrows 3 on the scanning pad 131 and some charges 4 may be accumulated on the scanning pad 131. A portion of the accumulated charges 4 will be grounded to the wafer substrate through the test structure 132, and grey level of the scanning pad will indicate a normal status or normal grey level.

Figure 4B:
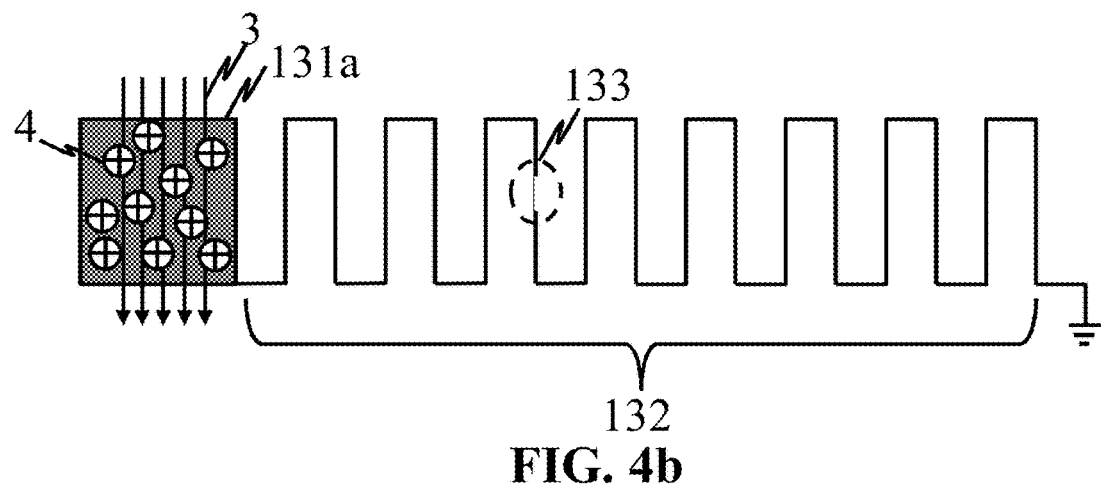
FIG. 4b is a schematic illustration of the test device for open circuit defect inspection in scribe line in abnormal status in accordance with the third embodiment of the present invention.

Please refer to FIG. 4b, if there is one defect of open circuit 133 in the test structure 132, the grey level of the scanning pad 131a will be different from the normal grey level of the scanning pad 131 in FIG. 4a, when the scanning pad 131a is scanned by the electron beam. In the present invention, when the scanning pad 131a is scanned with positive mode, the grey level of the scanning pad 131a will be darker than the normal grey level because the whole accumulated positive charging 4 can't be grounded through the test structure 133 and will attract more signal electrons back to the sample. If the scanning pad 131a is scanned with negative mode, the accumulated charging 4 would be negative and the grey level of the scanning pad 131a would be brighter than the normal grey level because the while negative charging 4 will repel more signal electrons into detector. In this and following embodiments, positive scanning mode will be illustrated for simplification.

Figure 5A:
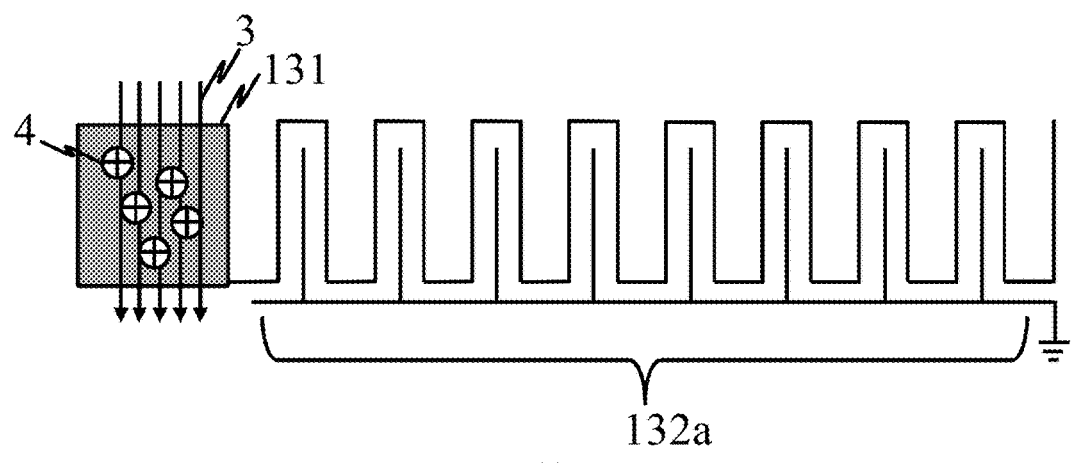
FIG. 5a is a schematic illustration of a test device for short circuit defect inspection in scribe line in normal status in accordance with a fourth embodiment of the present invention.

For the pattern in FIG. 4, only the defect of open circuit can be detected. If there is a defect of short circuit, the grey level would be the same. However, in order to detect defect of short circuit, another pattern must be designed. Please refer to FIG. 5a, the test structure 132a includes a periodic indentation pattern and a periodic comb pattern interlaced with each other but electrically isolated. The periodic indentation pattern is electrically connecting to the scanning pad 131 while the periodic comb pattern is grounded. The test structure 132a in the present embodiment also mimics or simulates the patterns of lines in group. The test device, in the present embodiment, is designed in the scribe line, so the periodic comb pattern can be grounded to the wafer substrate directly. When the scanning pad 131 is scanned by electron beam in the directions 3, whole accumulated charging 4 can't be grounded anymore, and the grey level of the scanning pad 131 indicates a normal grey level.

Figure 5B:
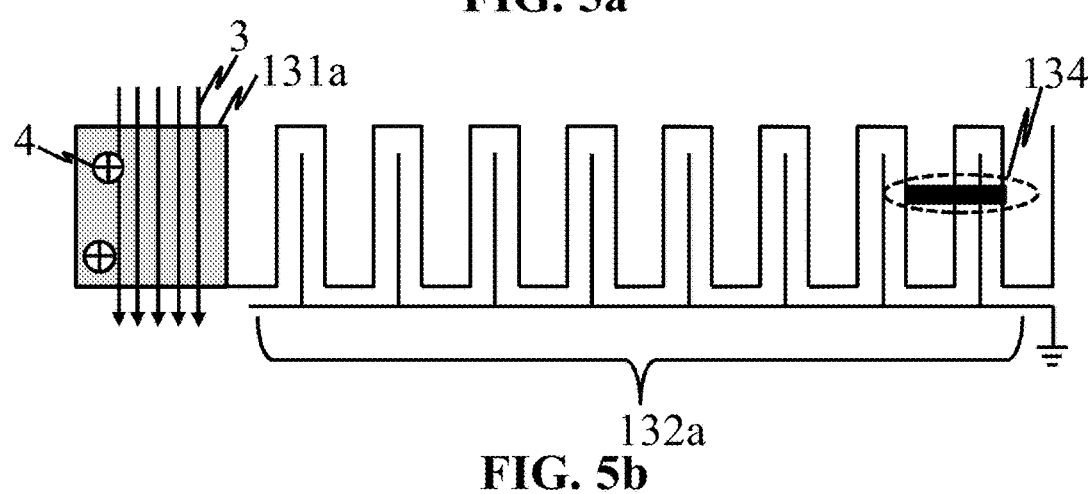
FIG. 5b is a schematic illustration of the test device for short circuit defect inspection in scribe line in abnormal status in accordance with the fourth embodiment of the present invention.

However, please refer to FIG. 5b, when there is a defect of short circuit 134 in the test structure 132a, the periodic indentation pattern and the periodic comb pattern are electrically connected. Hence, a portion of the accumulated charging 4 in the scanning pad 131a now will be grounded through the defect of short circuit 134, and the grey level of the scanning pad 131a is different from the normal grey level of scanning pad 131 in FIG. 5a. The grey level of the scanning pad 131a can be darker or brighter than the normal grey level which depends upon the positive mode or negative mode. If the scanning pad 131a is scanned with positive mode, some accumulated positive charging 4 will be grounded, and more signal electrons can arrive the detector to make the grey level of the scanning pad 131a brighter. On the other hand, if the scanning pad 131a is scanned with negative mode, the some accumulated negative charging 4 will be grounded, and less signal electrons can be repel to the detector to make the grey level of the scanning pad 131a much darker.

Figure 6A:
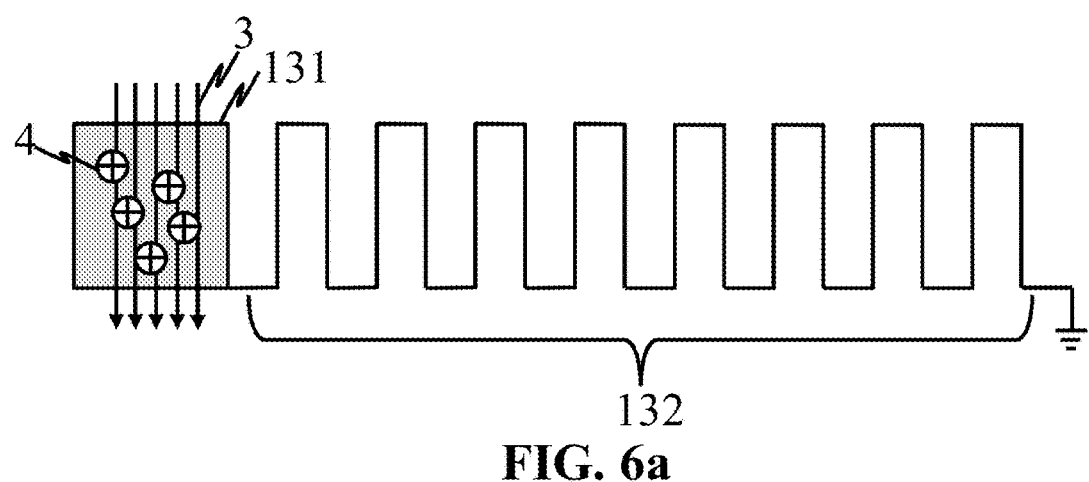
FIG. 6a is a schematic illustration of a test device for high impedance defect inspection in scribe line in normal status in accordance with a fifth embodiment of the present invention.

The present invention can be applied to the defect of high impedance detection. In the semiconductor process, some line patterns are formed much thinner due to lithographic process or etching process and the impedance of the line may be raised. Please refer to FIG. 6a, a grounded test structure 132 with a periodic indentation pattern is provided and electrically connects to the scanning pad 131. In the present embodiment, the periods in the test structure 132 should be much larger than the periods of the test structure 132 in the FIG. 4a, because the lengthy test key 132 with high impedance can reveal the result close to the defect of open circuit. If the periods of the test structure 132 are too less, the grey level of the scanning pad 131 will hard to show grey level difference. The suitable periods of the test structure 132 in the present embodiment depends upon the process node, semiconductor process, and the inspection conditions. The scanning pad 131 is scanned by the electron beam in the direction 3, and a portion of charging is grounded through the test structure 132 and some accumulated charging 4 remains in the scanning pad 131. The grey level of the scanning pad 131 indicates a normal grey level.

Figure 6B:
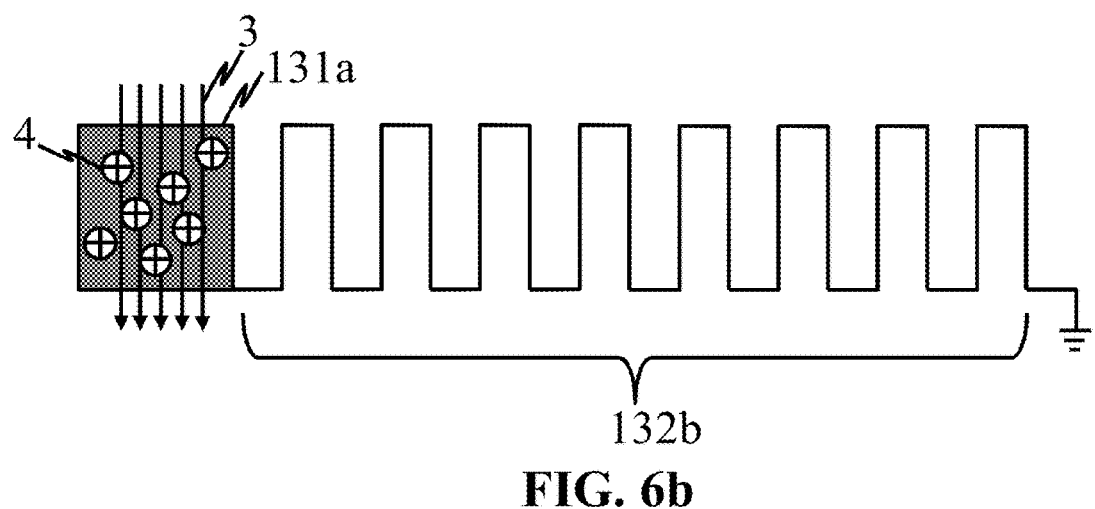
FIG. 6b is a schematic illustration of the test device for high impedance defect inspection in scribe line in abnormal status in accordance with the fifth embodiment of the present invention.

Please refer to FIG. 6b, the scanning pad 131a is scanned by the electron beam in the direction 3, and more accumulated charging 4 will be kept in the scanning pad 131a. Thus, the grey level of the scanning pad 131a is brighter or darker than the normal grey level in FIG. 6a, which depends upon the scanning mode is positive or negative. The grey level variant in the present embodiment will be less than the embodiment in FIG. 4.

Figure 7A:
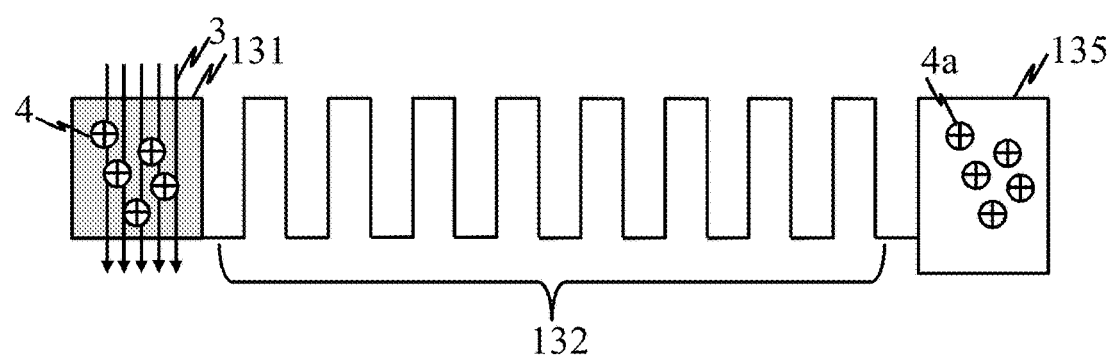
FIG. 7a is a schematic illustration of a test device for open circuit defect inspection in dummy pattern in normal status in accordance with a sixth embodiment of the present invention.

In one embodiment, if the test device is designed in the dummy pattern as in the FIG. 2, grounding to the wafer substrate is impossible because there are some other circuits or transistors beneath the dummy patterns. Thus a grounding pad is provided in the present invention. Please refer to FIG. 7a, one end of the test structure 132 is electrically connected to the scanning pad 131 while the other end of the test structure 132 is electrically to grounding pad 135. The grounding pad 135 must be enough larger than the size of the scanning pad 131 to receive charging from the scanning pad 131 as much as possible. When the scanning pad 131 is scanned by the electron beam in the direction 3, a portion of charging 4a is electrically conducted to the grounding pad 135, while a portion of the accumulated charging 4 still remains in the scanning pad 131. Thus, the remained charging 4 in the scanning pad 131 will reveal a normal grey level.

Figure 7B:
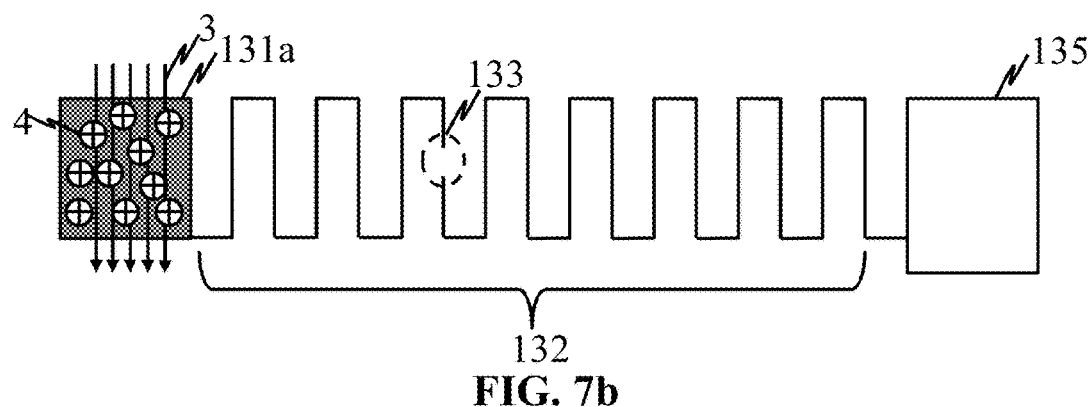
FIG. 7b is a schematic illustration of the test device for open circuit defect inspection in dummy pattern in abnormal status in accordance with the sixth embodiment of the present invention.

Please refer to FIG. 7b, there is a defect of open circuit 133 in the test structure 132a, and the whole accumulated charging 4, scanned by the electron beam in the direction 3, can't be electrically conducted to the grounding pad 135. Grey level of the scanning pad 131a is thus brighter or darker than the normal grey level of the scanning pad 131 in FIG. 7a, which depends upon the scanning mode is positive or negative.

Figure 8A:
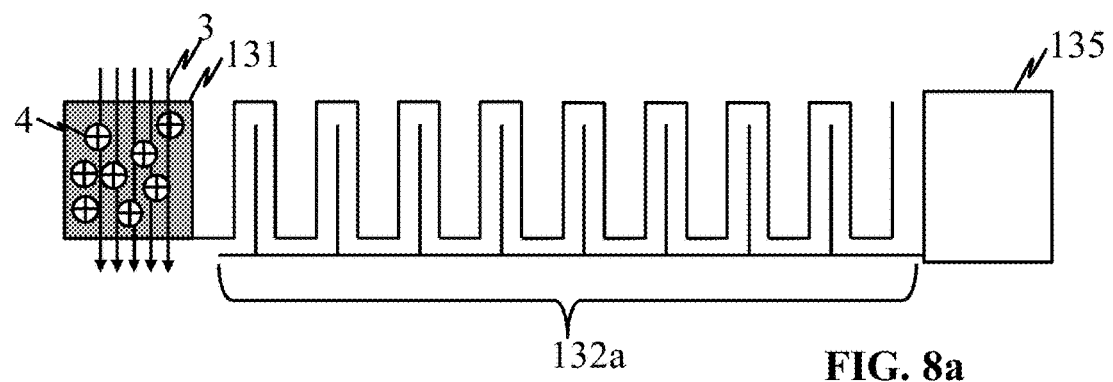
FIG. 8a is a schematic illustration of a test device for short circuit defect inspection in dummy pattern in normal status in accordance with a seventh embodiment of the present invention.

In order to detect the defect of the short circuit in the dummy pattern, similar pattern in FIG. 5 can be applied with a grounding pad. Please refer to FIG. 8a, a test structure 132a includes a periodic indentation pattern, with one end electrically connected to the scanning pad 131, is interlaced with a periodic comb pattern with one end opposite to the scanning pad 131 electrically connected to the grounding pad 135. In the normal situation, the scanning pad 131 is electrically isolated from the grounding pad 135. When the scanning pad 131 is scanned by the electron beam in the direction 3, all accumulated charging 4 can't be electrically conducted to the grounding pad 135. Thus, the grey level of the scanning pad is normal.

Figure 8B:
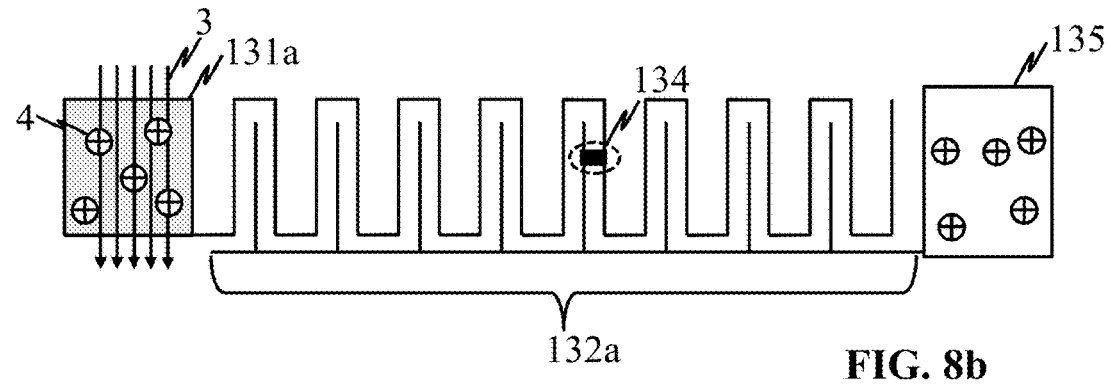
FIG. 8b is a schematic illustration of the test device for short circuit defect inspection in dummy pattern in abnormal status in accordance with the seventh embodiment of the present invention.

Please refer to FIG. 8b, when a defect of short circuit 134 in the test structure 134, the scanning pad 131a can be electrically connected to the grounding pad 135, and a portion of charging can be electrically conducted to the grounding pad 135. The grey level of the scanning pad 131a, thus different from the normal grey level, is brighter or darker, which depends upon the scanning mode is positive or negative.

Figure 9A:
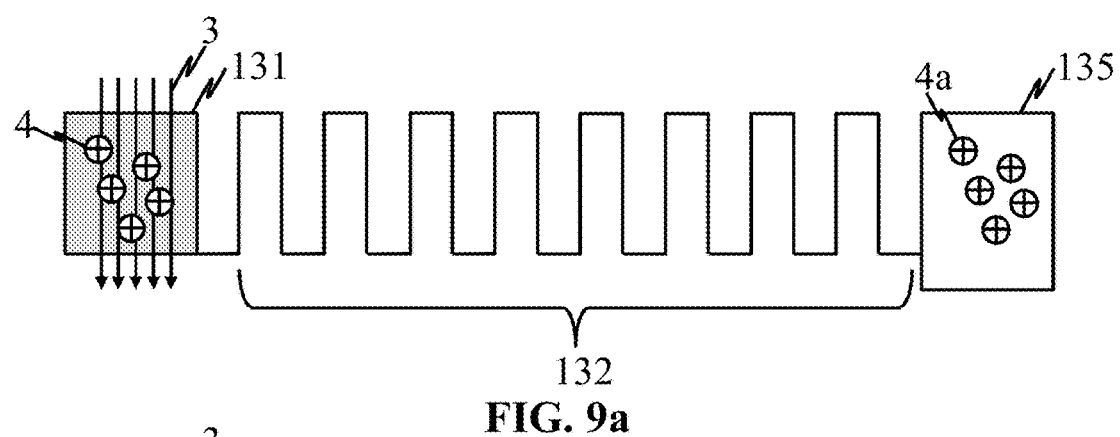
FIG. 9a is a schematic illustration of a test device for high impedance defect inspection in dummy pattern in normal status in accordance with an eighth embodiment of the present invention.

For the high impedance defect inspection, similar pattern in FIG. 6 can be applied also. Please refer to FIG. 9a, a test structure 132 with a periodic indentation pattern is provided. One end of the test structure 132 is electrically connected to a scanning pad 131 and the other end is electrically connected to a grounding pad 135. Similar to the embodiment in FIG. 6, the periods in the test structure 132 should be much larger than the periods of the test structure 132 in the FIG. 4a and FIG. 7a. The scanning pad 131 is scanned by the electron beam in the direction 3, and a portion of charging is grounded through the test structure 132 and some accumulated charging 4 remains in the scanning pad 131. The grey level of the scanning pad 131 indicates a normal grey level.

Figure 9B:
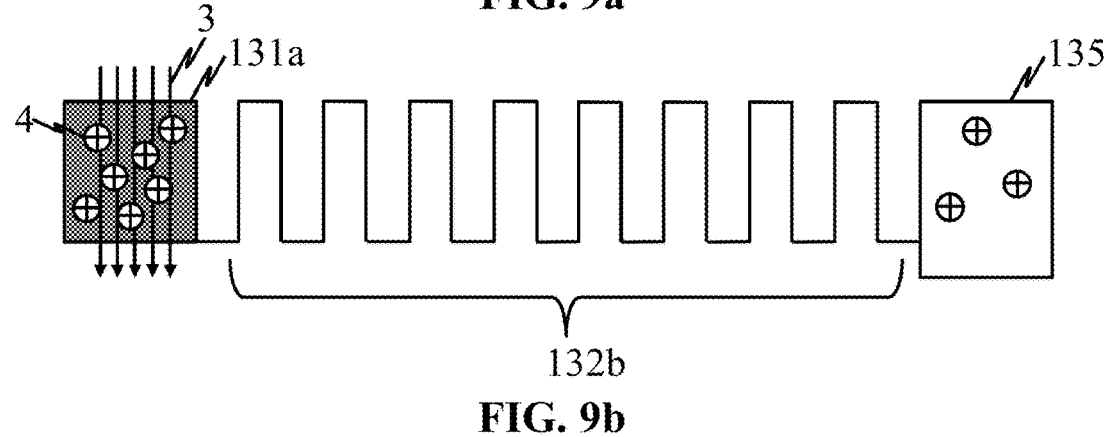
FIG. 9b is a schematic illustration of the test device for high impedance defect inspection in dummy pattern in abnormal status in accordance with the eighth embodiment of the present invention.

Please refer to FIG. 9b, the scanning pad 131a is scanned by the electron beam in the direction 3, and more accumulated charging 4 will be kept in the scanning pad 131a. Thus, the grey level of the scanning pad 131a is brighter or darker than the normal grey level in FIG. 6a, which depends upon the scanning mode is positive or negative. The grey level variant in the present embodiment will be less than the embodiment in FIG. 7.

Figure 10:
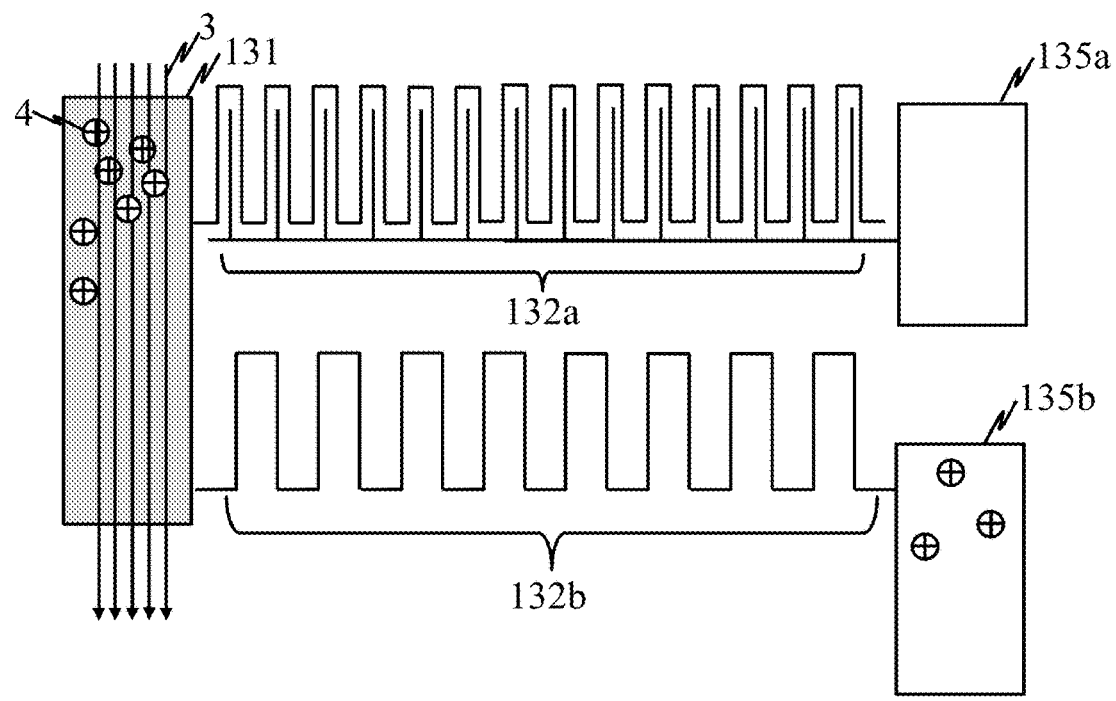
FIG. 10 is a schematic illustration of a hybrid test device for open/short circuit defect inspection in dummy pattern in normal status in accordance with a ninth embodiment of the present invention.

In the present invention, one embodiment for simultaneously detect defects of both open and short circuit is also available. Please refer to FIG. 10, there are two test structures 132a and 132b are electrically connecting one scanning pad 131, wherein the test structure 132a is applied to detect short circuit while the test structure 132b is applied to detect open circuit. The other ends of the test structures 132a and 132b are electrically connected to grounding pads 135a and 135b respectively. When the scanning pad 131 is scanned by the electron beam in the direction 3, several charging 4 are accumulated in the scanning pad 131. When there is no short defect in the test structure 132a, no charging will be conducted to the grounding pad 135a. When there is no open defect in the test structure 132b, some charging will be conducted to the grounding pad 135b. Therefore, four types of grey level of the scanning pad 131 can be identified to indicate if both the test structures 132a and 132b are normal, one of the test structures 132a and 132b is normal while the other is abnormal, and both the test structures 132a and 132b are abnormal.

Figure 11:
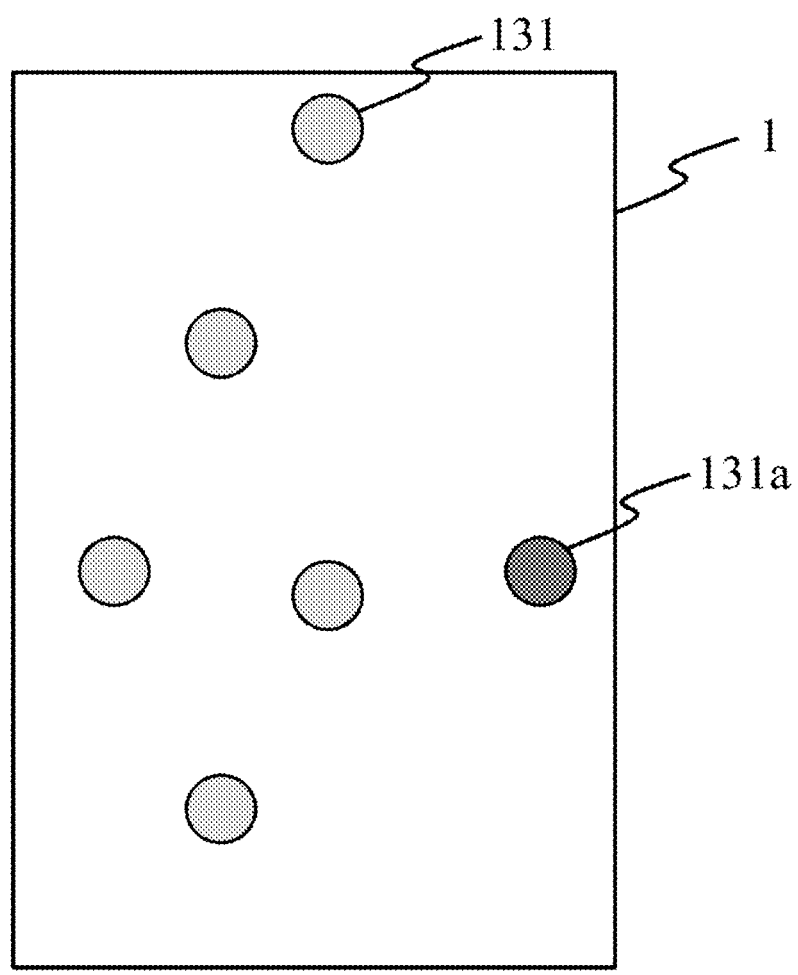
FIG. 11 is a schematic illustration of inspected result in a die in accordance with the present invention.
Figure 12:
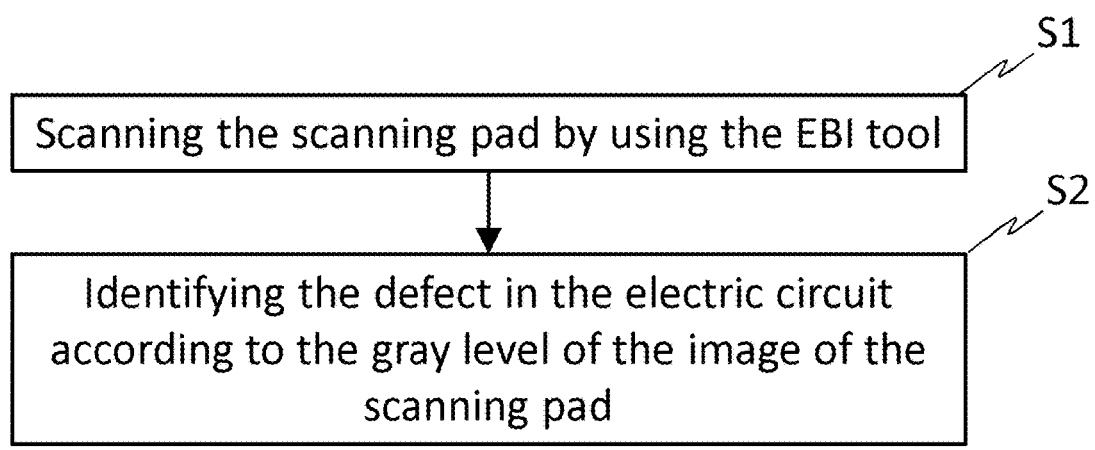
FIG. 12 is a flow chart of a method for VC mode open/short defect inspection by using an EBI tool.

For one test device in one dummy pattern is scanned with the grey level of the test device is obtained, several test devices in corresponding dummy patterns can be scanned and a brief results can be referred to FIG. 11. In the die 1, there are six dummy patterns in which there are five of the dummy patterns 131 indicate the grey level of test devices normal, and one of the dummy pattern 131a indicates the grey level of the test devices abnormal. Thus, in FIG. 11, the die 1 may indicate some patterns around the dummy pattern 131a may have defects and thus another high resolution tool has to be applied to inspect In the present invention, a method for VC mode open/short defect inspection by using an EBI tool is disclosed and as shown in FIG. 12. The method comprises a step of scanning the scanning pad by using at least one electron beam of the EBI tool, and a step of identifying the open/short defect in the electric circuit according to the grey level of the image of the scanning pad.

The most important advantage in the present invention is the VC mode inspection. For the conventional open/short defect inspection, high resolution condition must be applied to the ebeam inspection tool for scanning fine pattern, because small beam current must be used to prevent from aberration being incurred by Coulomb repulsive force. The fewer beams current is used, the fewer signal electrons can be collected, which will deteriorate throughput significantly. Further, in order to identify the open/short circuit, every detail fine pattern must be scanned, instead of a scanning pad; that means a lot of care area must be scanned. If most fine patterns are normal, a lot of time is consumed. If one line pattern is thinner instead of an open defect, for an image of this line pattern, careful identifying every detail in this pattern image is also very time-consuming. However, in the present invention, by the grey level of the scanning pad, whether an open/short defect can be easily identified almost immediately. Although the location of the defect is not available, but a lot of time can be skipped for scanning the normal patterns. Furthermore, due to VC mode, resolution is not critical and large beam current can be used for defect inspection.

Compared to any prior art, it is impossible to identify open/short circuit to the line pattern by using VC mode, because conventional VC mode inspection is to detect open/short defects in contact/via, and contact/via is scanned directly. And, the scanning pad is always larger than the contact/via, and defect can be more easily identified on the larger area of the scanning pad.

Another advantage in the present invention is the test device can be designed in the dummy pattern. There is no function to the dummy pattern and the use of dummy pattern for defect inspection will incur no cost in the semiconductor manufacture. Another advantage of using dummy pattern is that the test device will share the identical semiconductor process, which will indicate the exact situations and status of the electronic device. If there is any defect is detected in one test device, there must be very certainly a real defect around the test device. Moreover, the dummy pattern is always float and VC mode inspection will be further enhanced.

Although the present invention has been explained in relation to its preferred embodiment, it is to be understood that other modifications and variation can be made without departing the spirit and scope of the invention as hereafter claimed.

What is claimed is:

1. A device, comprising:
    a scanning pad on a dielectric layer, the scanning pad being an electrically conductive pad scanned by a charged particle beam tool, the dielectric layer being formed on a wafer substrate and having a circuit pattern formed thereon;
    a second electrically conductive pad having an area larger than an area of the scanning pad; and
    a test structure on the dielectric layer and not overlapping with the scanning pad, the test structure being an electric circuit having a first end electrically connected to the scanning pad and a second end electrically connected to the second electrically conductive pad, the scanning pad and test structure being electronically insulated from the circuit pattern;
    wherein an image of the scanning pad generated by the charged particle beam tool scanning the scanning pad has a grey level corresponding to presence or absence of a defect in the circuit pattern; and
    wherein the test structure is not grounded to the wafer substrate.

2. The device according to claim 1, wherein the test structure is located at scribe lines of a wafer.

3. The device according to claim 1, wherein the test structure is designed as a dummy pattern in a die.

4. The device according to claim 1, wherein the test structure includes a periodic pattern.

5. The device according to claim 4, wherein the periodic pattern is a periodic indentation pattern for detecting an open circuit defect.

6. The device according to claim 1, wherein the test structure includes a first periodic pattern and a second periodic pattern.

7. The device according to claim 6, wherein:
    the first periodic pattern is a periodic indentation pattern, and
    the second periodic pattern is a periodic comb pattern interlacing with the first periodic pattern for detecting a short circuit defect.

8. The device according to claim 7, wherein:
    the first end of the test structure is one end of the first periodic pattern, and
    the second end of the test structure is one end of the second periodic pattern opposite to the first end of the test structure.

9. The device according to claim 1, wherein the charged particle beam tool is an electron beam inspection tool.

10. The device according to claim 1, wherein the defect is identified in a voltage contrast mode of the charged particle beam tool.

11. The device according to claim 1, wherein the test structure includes a periodic pattern.

12. The device according to claim 11, wherein the periodic pattern is a periodic indentation pattern for detecting an open circuit defect.

13. The device according to claim 1, wherein the test structure includes a first periodic pattern and a second periodic pattern.

14. The device according to claim 13, wherein:
    the first periodic pattern is a periodic indentation pattern, and
    the second periodic pattern is a periodic comb pattern interlacing with the first periodic pattern for detecting a short circuit defect.

15. The device according to claim 14, wherein:
    the first end of the test structure is one end of the first periodic pattern, and
    the second end of the test structure is one end of the second periodic pattern opposite to the first end of the test structure.

16. A method for inspecting a defect, comprising:
    scanning a scanning pad on a dielectric layer by using a charged particle tool, the scanning pad being an electrically conductive pad, the dielectric layer having a test structure and a circuit pattern formed thereon, the scanning pad and test structure being electronically insulated from the circuit pattern,
    wherein the test structure:
        is an electric circuit having a first end electrically connected to the scanning pad and a second end electrically grounded, and
        does not overlap with the scanning pad, and wherein scanning the scanning pad does not include scanning the test structure;

generating an image of the scanning pad based on data generated from the scanning of the scanning pad; and identifying a defect in the circuit pattern according to a grey level of the image of the scanning pad.

17. The method according to claim 16, wherein the test structure is designed as a dummy pattern in a die.

18. The method according to claim 17, wherein the second end of the test structure is electrically connected to a grounding pad which has an area larger than an area of the scanning pad.

19. The method according to claim 18, wherein the defect is identified using a voltage contrast mode of the charged particle tool.

20. The method according to claim 19, wherein the test structure includes a periodic pattern.

21. The method according to claim 20, wherein the periodic pattern is a periodic indentation pattern for detecting an open circuit defect.

22. The method according to claim 19, wherein the test structure includes a first periodic pattern and a second periodic pattern.

23. The method according to claim 22, wherein:

the first periodic pattern is a periodic indentation pattern, and the second periodic pattern is a periodic comb pattern interlacing with the first periodic pattern for detecting a short circuit defect.

24. The method according to claim 23, wherein:

the first end of the test structure is one end of the first periodic pattern, and the second end of the test structure is one end of the second periodic pattern opposite to the first end of the test structure.

* * * * *